(12) United States Patent
Hsu et al.

(10) Patent No.: US 6,713,791 B2
(45) Date of Patent: Mar. 30, 2004

(54) T-RAM ARRAY HAVING A PLANAR CELL STRUCTURE AND METHOD FOR FABRICATING THE SAME

(75) Inventors: Louis L. Hsu, Fishkill, NY (US); Rajiv V. Joshi, Yorktown Heights, NY (US); Fariborz Assaderaghi, Mahopac, NY (US); Dan Moy, Bethel, CT (US); Werner Rausch, Stormville, NY (US); James Culp, Poughkeepsie, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/770,788

(22) Filed: Jan. 26, 2001

(65) Prior Publication Data

US 2002/0100918 A1 Aug. 1, 2002

(51) Int. Cl.[7] .............................................. H01L 29/74
(52) U.S. Cl. ...................... 257/200; 257/133; 257/147; 257/162
(58) Field of Search ................................ 257/133, 147, 257/162, 200, 369, 135, 136, 138, 139, 152, 371, 393; 365/174, 180

(56) References Cited

U.S. PATENT DOCUMENTS

| | | | | |
|---|---|---|---|---|
| 5,324,966 A | * | 6/1994 | Muraoka et al. | 257/136 |
| 5,412,598 A | * | 5/1995 | Shulman | 365/174 |
| 5,619,450 A | * | 4/1997 | Takeguchi | 365/185.23 |
| 5,936,267 A | * | 8/1999 | Iwamuro | 257/147 |
| 5,945,715 A | * | 8/1999 | Kuriyama | 257/369 |
| 6,229,161 B1 | * | 5/2001 | Nemati et al. | 257/133 |

OTHER PUBLICATIONS

*A Novel–Thyristor–based SRAM Cell (T–RAM) for High––Speed, Low Voltage, Giga–scale Memories* by Farid Nemati and James D. Plummer, Center for Integrated Systems, Stanford, University, 1999.
*A Novel High Density, Low–Voltage SRAM Cell with a Vertical NDR Device*, by Farid Nemati and James D. Plummer, Center for Integrated Systems, Stanford University, 1998.

* cited by examiner

Primary Examiner—David Nelms
Assistant Examiner—Dao H. Nguyen
(74) Attorney, Agent, or Firm—Dilworth & Barrese, LLP

(57) ABSTRACT

A T-RAM array having a planar cell structure is presented. The T-RAM array includes n-MOS and p-MOS support devices which are fabricated by sharing process implant steps with T-RAM cells of the T-RAM array. A method is also presented for fabricating the T-RAM array having the planar cell structure. The method entails simultaneously fabricating a first portion of a T-RAM cell and the n-MOS support device; simultaneously fabricating a second portion of the T-RAM cell and the p-MOS support device; and finishing the fabrication of the T-RAM cell by interconnecting the T-RAM cell with the p-MOS and n-MOS support devices. The first portion of the T-RAM cell is a transfer gate and the second portion of the T-RAM cell is a gated-lateral thyristor storage element. Accordingly, process steps in fabricating the T-RAM cells are shared with process steps in fabricating the n-MOS and p-MOS support devices. The n-MOS and p-MOS support devices refer to sense amplifiers, wordline drivers, column and row decoders, etc. which are connected to the T-RAM array.

7 Claims, 4 Drawing Sheets

T-RAM ARRAY HAVING A PLANAR CELL STRUCTURE AND METHOD FOR FABRICATING THE SAME

FIELD OF THE INVENTION

This invention relates to the field of integrated circuit (IC) design. Specifically, it relates to a Thyristor Random Access Memory (T-RAM) array having a planar cell structure and method for fabricating the same.

BACKGROUND OF THE INVENTION

A low-power, high-speed and high-density negative differential resistance (NDR) based (NDR-based) SRAM cell which can provide DRAM-like densities at SRAM-like speeds has been proposed by Farid Nemati and James D. Plummer in "A Novel High Density, Low Voltage SRAM Cell with a Vertical NDR Device," 1998 Symposium on VLSI Technology Digest of Technical Papers, IEEE, pages 66–67, 1998.

The memory device structure is shown by FIG. 1 and is designated by reference numeral 10; the memory device structure is called a Thyristor-based Random Access Memory (T-RAM) cell. The T-RAM cell 10 consists of a thin vertical pnpn thyristor 12 with a surrounding nMOS gate 14 as the bistable element and a planar nMOSFET as the access transistor 16. The circuit schematic of the T-RAM cell 10 is shown by FIG. 2.

To access the T-RAM cell 10, two wordlines are necessary. The first wordline WL1 is used to control an access gate of the transfer nMOSFET device 16, while the second wordline WL2 is the surrounding nMOS gate 14 which is used to control the switch of the vertical pnpn thyristor 12. The thyristor 12 is connected to a reference voltage Vref. The second wordline WL2 improves the switching speed of the thyristor 12 from 40 ns to 4 ns with a switching voltage. A bitline BL connects the T-RAM cell 10 to a sense amplifier for reading and writing data from and to the T-RAM cell 10. The T-RAM cell 10 exhibits a very low standby current in the range of 10 pA.

When writing a "high", the bitline BL is set at low, and both wordlines WL1, WL2 are switched on. At this moment, the thyristor 12 behaves like a forward biased pn diode. After a write operation, both gates are shut off, and a "high" state is stored in the thyristor 12. In a read operation, only the first wordline WL1 is activated, a large "on" current will read on the bitline BL through the access gate. When writing a "low", the bitline BL is set at "high" state, and both wordlines WL1, WL2 are switched on. At this moment, the thyristor 12 behaves like a reverse biased diode. After the write operation, both gates are shut off, and a "low" state is stored in the thyristor 12. Similarly, in a consequence read, a very low current will be detected on the bitline BL. Further details of the operation of the T-RAM cell 10 and its gate-assisted switching are described in Nemati et al.; the contents of which are incorporated herein by reference.

A T-RAM array having a plurality of T-RAM cells 10 has demonstrated a density equivalent to that of DRAM arrays and a speed equivalent to that of SRAM arrays. Hence, the T-RAM array provides advantages afforded by both SRAM and DRAM arrays. These advantages make T-RAM an attractive choice for future generations of high speed, low-voltage, and high-density memories and ASICs.

However, there are several drawbacks of the T-RAM cell 10. First, there is the requirement of forming the thyristor 12 having a vertical pillar on a substrate during a fabrication process. Difficulties arise in controlling the dimensions of the vertical pillar and reproducing these dimensions for each T-RAM cell 10 in the T-RAM array. Second, due to the existence of a vertical thyristor 12 in each T-RAM cell 10, each T-RAM cell 10 is not planar and therefore difficult to scale. Third, it is difficult to control the dimension while forming the surrounding gate around the base of each vertical thyristor 12. Fourth, each T-RAM cell is fabricated prior to or after fabricating any other devices, such as p-MOS and n-MOS support devices (i.e., sense amplifiers, wordline drivers, column and row decoders, etc.), which results in extra fabrication steps, thereby increasing thermal budget and manufacturing cost. Finally, due to these drawbacks, the resulting T-RAM cell 10 cannot be smaller than $8F^2$ and the cost of fabricating a T-RAM array is high.

SUMMARY

An aspect of the present invention is to provide a T-RAM array having a planar cell structure for overcoming the disadvantages of the prior art.

Another aspect of the present invention is to provide a T-RAM array having a plurality of T-RAM cells, wherein each of the plurality of T-RAM cells has a planar cell structure and includes n-MOS and p-MOS support devices which are fabricated by sharing process implant steps with the T-RAM cells. The n-MOS and p-MOS support devices refer to sense amplifiers, wordline drivers, column and row decoders, etc.

Also, another aspect of the present invention is to provide a memory system having a plurality of T-RAM cells arranged in an array, wherein each of the plurality of T-RAM cells has a planar cell structure and includes n-MOS and p-MOS support devices which are fabricated by sharing process implant steps with the T-RAM cells.

Further, another aspect of the present invention is to provide a method for fabricating a high-density, high-yield and low-cost T-RAM array having a planar cell structure on a SOI substrate.

Finally, another aspect of the present invention is to provide a method for fabricating a T-RAM array which improves the yield, reduces cost and thermal budget by sharing process implant steps among different devices, e.g., the plurality of T-RAM cells of a T-RAM array, the n-MOS and p-MOS support devices, etc., and allows for scaling based on the lithographic ground rule. The shared processes can be ion implantation, diffusion, annealing and silicidation.

Accordingly, in an embodiment of the present invention, a T-RAM array having a planar cell structure is presented. The T-RAM array includes n-MOS and p-MOS support devices which are fabricated by sharing process implant steps with T-RAM cells of the T-RAM array.

In another embodiment of the present invention, a T-RAM array having a plurality of T-RAM cells is presented, wherein each of the T-RAM cells has a planar cell structure and the array includes n-MOS and p-MOS support devices. Process steps in fabricating the T-RAM cells are shared with process steps in fabricating the n-MOS and p-MOS s.

Further, in another embodiment of the present invention, a memory system having a plurality of T-RAM cells arranged in an array. Each of the T-RAM cells in the array has a planar cell structure and the array includes n-MOS and p-MOS s interconnected with the plurality of T-RAM cells. Process steps in fabricating the T-RAM cells are shared with process steps in fabricating the n-MOS and p-MOS s.

Further still, in another embodiment of the present invention, a method is presented for fabricating a T-RAM array having a planar cell structure. Each of the T-RAM cells in the T-RAM array is fabricated while fabricating n-MOS and p-MOS s. The method entails fabricating a first portion of a T-RAM cell, while fabricating the n-MOS (i.e., simultaneously fabricating the first portion of the T-RAM cell and the n-MOS support device); fabricating a second portion of the T-RAM cell, while fabricating the p-MOS support device (i.e., simultaneously fabricating the second portion of the T-RAM cell and the p-MOS support device); and finishing the fabrication of the T-RAM cell by interconnecting the T-RAM cell with the p-MOS and n-MOS support devices.

In particular, a method is presented for fabricating a T-RAM array having a plurality of T-RAM cells and first and second devices on a semiconductor wafer. The method includes the steps of simultaneously fabricating a first portion of each of the plurality of T-RAM cells and the first devices; and simultaneously fabricating a second portion of each of the plurality of T-RAM cells and the second devices. The first portion of each of the plurality of T-RAM cells is a transfer gate and the second portion of each of the plurality of T-RAM cells is a gated-lateral thyristor storage element.

Accordingly, process steps in fabricating the T-RAM cells are shared with process steps in fabricating the first and second devices. As a result, the process steps (and cost) are significantly reduced while increasing the yield. In addition, the thermal budget associated mainly with the annealing and drive-in diffusion steps is also reduced. Preferably, the T-RAM array, which includes the n-MOS and p-MOS support devices, is built on a semiconductor silicon-on-insulator (SOI) wafer to reduce junction capacitance and improve scalability.

DETAILED DESCRIPTION OF THE INVENTION

The present invention provides a T-RAM array having a plurality of T-RAM cells which are not provided with a vertical thyristor and a surrounding gate as prior art T-RAM cells. Hence, the T-RAM array of the present invention provides for less control during manufacturing, and is planar and more scalable than prior art T-RAM arrays. The present invention also provides a preferred method for fabricating the T-RAM array to reduce cost and thermal budget, while increasing density and yield.

Figure 3:
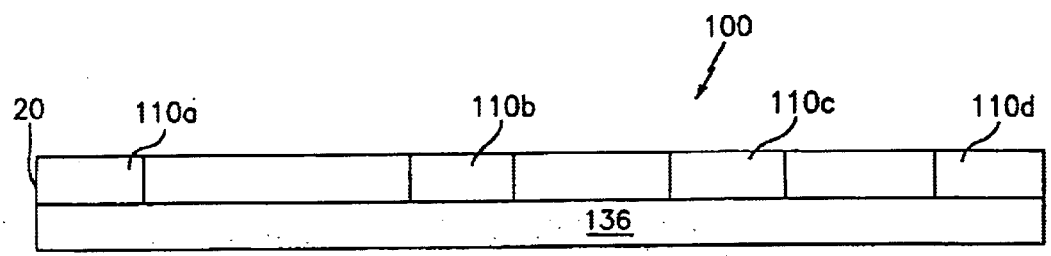
FIG. 3 is a cross-sectional view of a portion of a semiconductor silicon-on-insulator (SOI) wafer having a buried oxide layer and a series of shallow trench isolations (STIs) for fabricating T-RAM cells and n-MOS and p-MOS support devices according to the present invention.

FIG. 3 is a cross-sectional view of a portion of a semiconductor silicon-on-insulator (SOI) wafer having a series of shallow trench isolations (STIs) for fabricating T-RAM cells and n-MOS and p-MOS support devices according to the present invention. The wafer is designated by reference numeral 100. It is contemplated that other types of semiconductor wafers besides semiconductor SOI wafers, such as semiconductor bulk wafers, can be used for fabricating T-RAM cells according to the present invention. The n-MOS and p-MOS support devices refer to sense amplifiers, word-line drivers, column and row decoders, etc. which are connected to the T-RAM array.

A description of the preferred method for fabricating a T-RAM cell of the T-RAM array will now be provided. The same fabrication method is used for simultaneously fabricating all of the T-RAM cells of the T-RAM array. With reference to FIGS. 4–13 there are shown cross-sectional views of the semiconductor wafer 100 for fabricating the T-RAM cell. As indicated above, the semiconductor wafer 100 is a semiconductor SOI wafer, where active areas for fabricating devices are defined by shallow trench isolations (STI) 110a–d.

Figure 4:
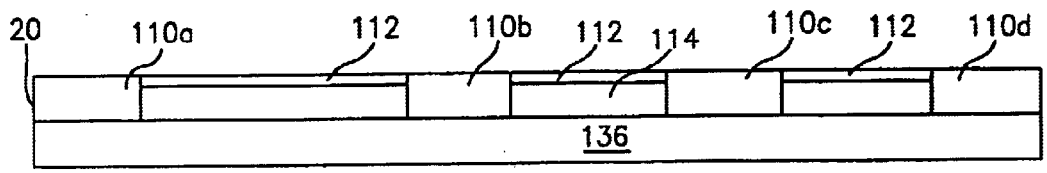
FIGS. 4–13 are cross-sectional views illustrating a preferred process for fabricating a T-RAM cell and n-MOS and p-MOS support devices according to the present invention.

With reference to FIG. 3, the semiconductor SOI wafer 100 having a buried oxide layer 136 and silicon layer 20 is used as the substrate to form the T-RAM cells. The STIs 110a–d are formed in a conventional manner. With reference to FIG. 4, gate oxides 112 are formed and threshold implants 114 are provided in the silicon layer 20.

Figure 5:
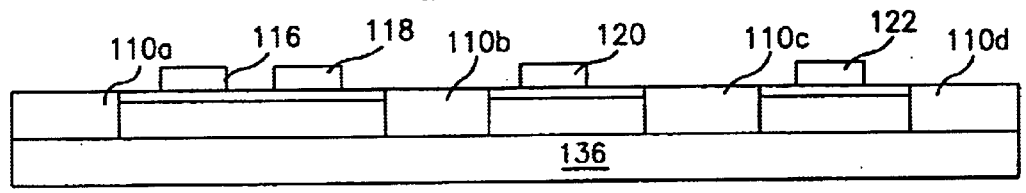
Figure 6:
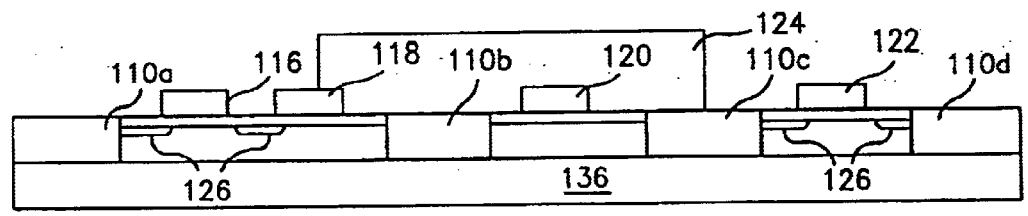

With reference to FIG. 5, gate conductors 116, 118 are then formed for the T-RAM cell using polysilicon. Gate conductors 120, 122 are also formed for the p-MOS and n-MOS support devices, respectively, using polysilicon. With reference to FIG. 6, a first mask 124 is used to cover a portion of the unfabricated T-RAM cell and p-MOS support device. n-MOS extension implants 126 are applied to a transfer gate portion of the T-RAM cell and n-MOS support device. Preferably, each of the n-MOS extension implants 126 is an arsenic implant at an energy in the range of 2–15 Kev and the dose is between $8E14/cm^2$ and $3E15/cm^2$.

Figure 7:
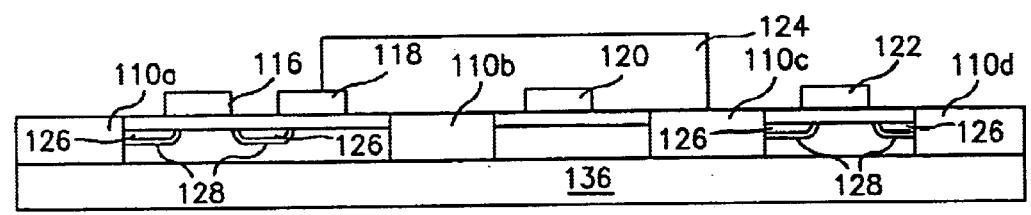

With reference to FIG. 7, p-type halo implants 128 are applied to prevent device punch-through. The p-type halo implants 128 are preferably applied by using either boron or BF2 implants for the transfer gate portion of the T-RAM cell and n-MOS support device. The preferred energy range for boron is 5–30 Kev and for BF2 is 20–120 Kev. The dose of the p-type halo implants 128 is preferably from $4E13/cm^2$ to $1E14/cm^2$. Preferably, the p-type halo implants 128 are implanted at an angle from 5 to 40 degrees. Also, preferably, a combination of boron and BF2 implants may be used having the energy ranges indicated above, and a combined dose in the same range as indicated above, i.e., $4E13/cm^2$ to $1E14/cm^2$.

Figure 8:
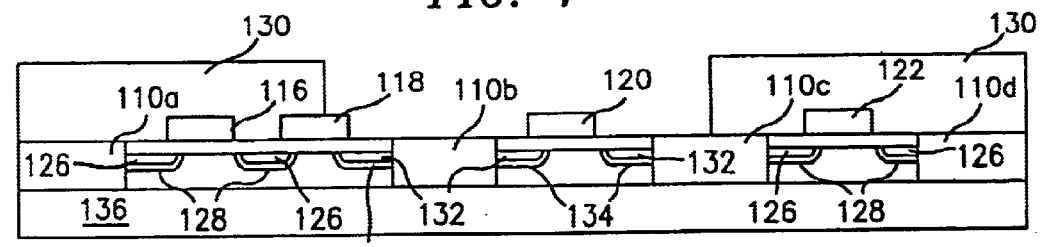

With reference to FIG. 8, the first mask 124 is removed and a second mask 130 is used to cover the transfer gate portion of the T-RAM cell and n-MOS support device. Preferably, the second mask 130 is a complement of the first mask 124. p-MOS extension implants 132 are then applied to a gated-lateral thyristor storage element portion of the T-RAM cell and p-MOS support device. Preferably, each of the p-MOS extension implants 132 is a BF2 implant at an energy in the range of 3–15 Kev. Boron may also be used at an energy in the range of 0.5–2 Kev. The preferred dose for the p-MOS extension implants 132 is between $2E14/cm^2$ and $8E14/cm^2$.

With continued reference to FIG. 8, n-type halo implants 134 are fabricated by preferably using an arsenic implant in the energy range of 50–120 Kev. The dose of the n-type halo implants 134 is preferably from $2E13/cm^2$ to $8E13/cm^2$.

Preferably, the n-type halo implants 134 are implanted at an angle from 5 to 40 degrees. Phosphorus or antimony implants (or a combination of arsenic, phosphorus and antimony implants) may also be used for the n-type halo implants 134 with energy ranges of 25–60 Kev and 50–150 Kev, respectively, and a dose of $2E13/cm^2$ to $8E13/cm^2$. Preferably, the annealing conditions for the n-MOS extension implants 126, the p-type halo implants 128, p-MOS extension implants 132, and the n-type halo implants 134 is rapid thermal annealing (RTA) for five seconds per wafer at a temperature range of 900–1025 degrees Celsius.

Figure 9:
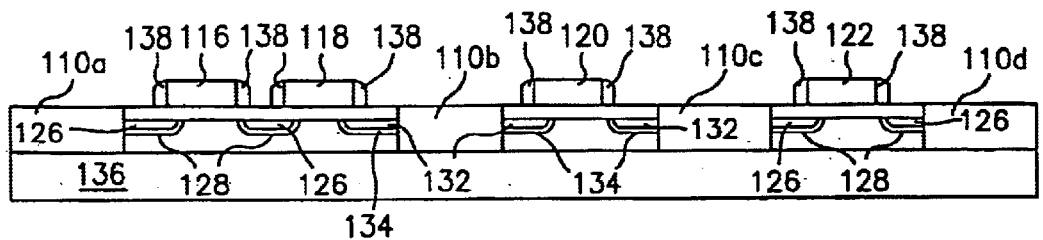

With reference to FIG. 9, after the second mask 130 is removed, sidewall spacers 138 are formed by thermal oxidation and CVD nitride deposition and an etch-back process The sidewall spacers 138 are used to source/drain implant away from a channel region to reduce the electrical field in the channel region, and increase the T-RAM cell's reliability. The sidewall spacers 138 also assist in forming a self-aligned silicide formation as described below.

Figure 10:
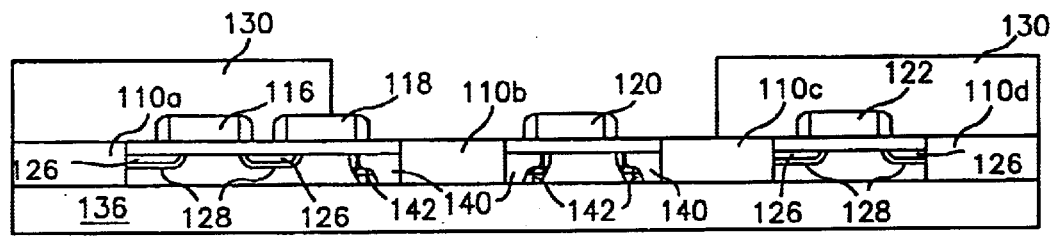

With reference to FIG. 10, the second mask 130 is re-used to form a p-type S/D (source/drain) implant 140 having an n-halo region 142 for the thyristor portion of the T-RAM cell and p-MOS support device. Preferably, a boron implant is used at an energy range of 5–20 Kev and a dose of $2E15/cm^2$ to $5E15/cm^2$.

Figure 11:
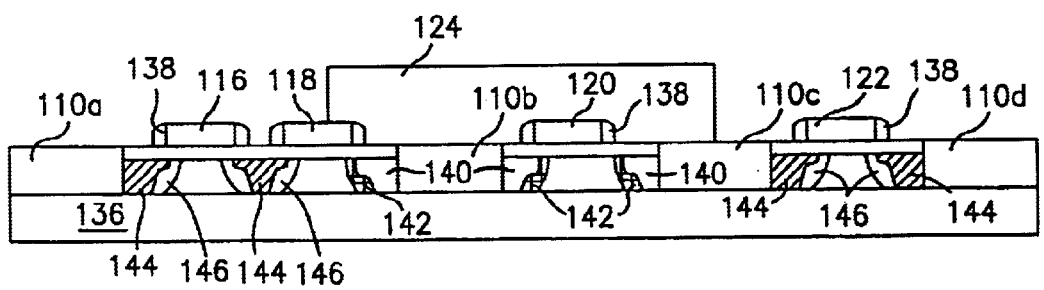

With reference to FIG. 11, the second mask 130 is removed and the first mask 124 is re-used to form an n-type S/D implant 144 having a p-halo region 146 for the unfabricated T-RAM cell and n-MOS support device. Preferably, either phosphorus or arsenic implant (or a combination of both) is used with a dose of $3E15/cm^2$ to $1.5E16/cm^2$. The energy range for phosphorus is between 5–30 Kev and the energy range for arsenic is between 10–60 Kev.

Figure 12:
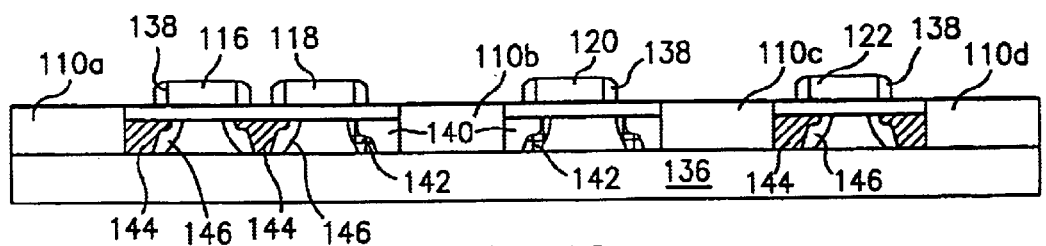

With reference to FIG. 12, the first mask 124 is removed and the wafer is annealed. Preferably, the annealing conditions are the same as the annealing conditions for the n-MOS extension implants 126, the p-type halo implants 128, p-MOS extension implants 132, and the n-type halo implants 134.

Figure 13:
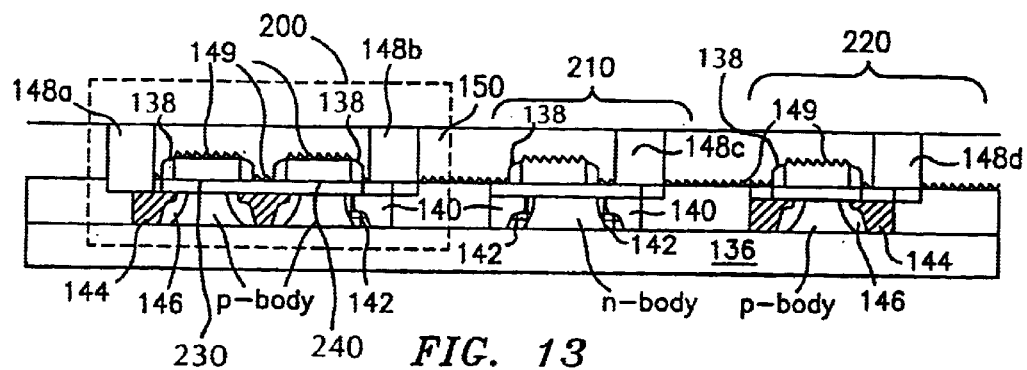

With reference to FIG. 13, silicidation is performed by preferably using sputter cobalt and using the conventional two-step annealing process. That is, first RTA is performed for eighty seconds per wafer at a temperature range from 550 to 600 degrees Celsius, and the unreacted cobalt is stripped in a sulfuric peroxide solution. Second, annealing is done at 750 degrees Celsius for thirty seconds per wafer. Accordingly, the T-RAM cell, p-MOS and n-MOS support devices designated generally by reference numerals 200, 210 and 220, respectively, are finished. The transfer gate and thyristor portions of the T-RAM cell 200 are designated generally by reference numerals 230 and 240, respectively.

Contacts 148a–d, which includes bitline contact 148a and Vref contact 148b, are then formed in a conventional manner before coating the structure with silicide 149 to form the self-aligned silicide formation. The sidewall spacers 138 assist in self-aligning the silicide 149 within the gap between the transfer gate and thyristor portions of the T-RAM cell 200; within the gap between the bitline contact 148a and the transfer gate portion of the T-RAM cell 200; and within the gap between the thyristor portion of the T-RAM cell 200 and the Vref contact 148b. The structure is then covered with a thick insulating material 150.

Figure 14:
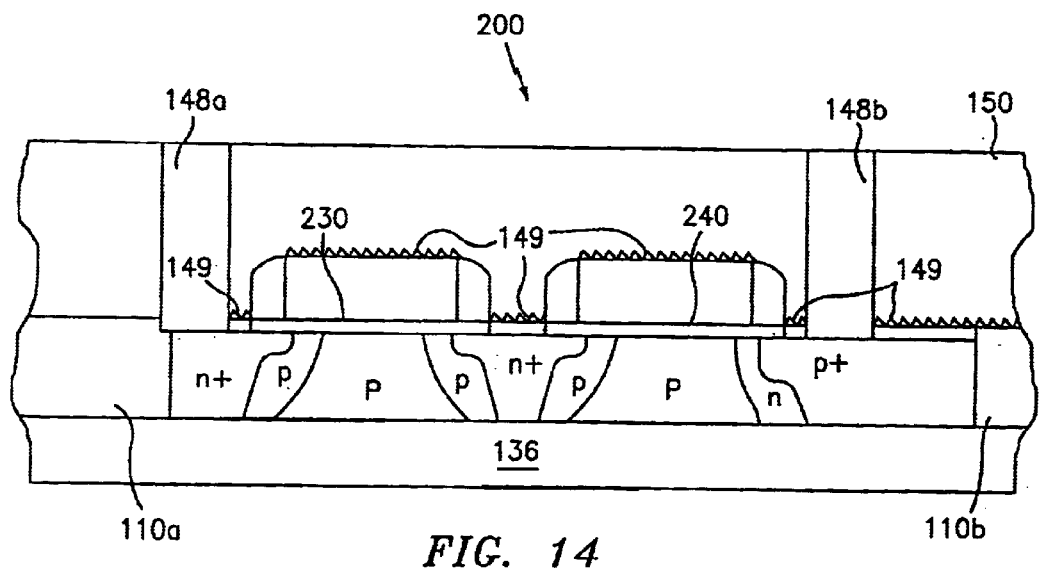
FIG. 14 is an enlarged cross-sectional view of a T-RAM cell fabricated according to the present invention.

FIG. 13 also indicates the p- and n-bodies of the structure. FIG. 14 is an enlarged cross-sectional view of the T-RAM cell 200 shown in FIG. 13.

As is known to one of ordinary skill in the art, a transfer gate and thyristor each comprises at least one source, one drain, and one body. With reference to FIG. 14, it is shown that transfer gate 230 and thyristor 240 each has a horizontal configuration. Thus, the horizontal configuration of transfer gate 230 includes a source, a drain, and a body located on a horizontal plane, wherein the horizontal plane is approximately parallel to the top surface of substrate 136. Moreover, the horizontal configuration of thyristor 240 includes a source, a drain, and a body located on a horizontal plane, wherein the horizontal plane is approximately parallel to the top surface of substrate 136.

Figure 1:
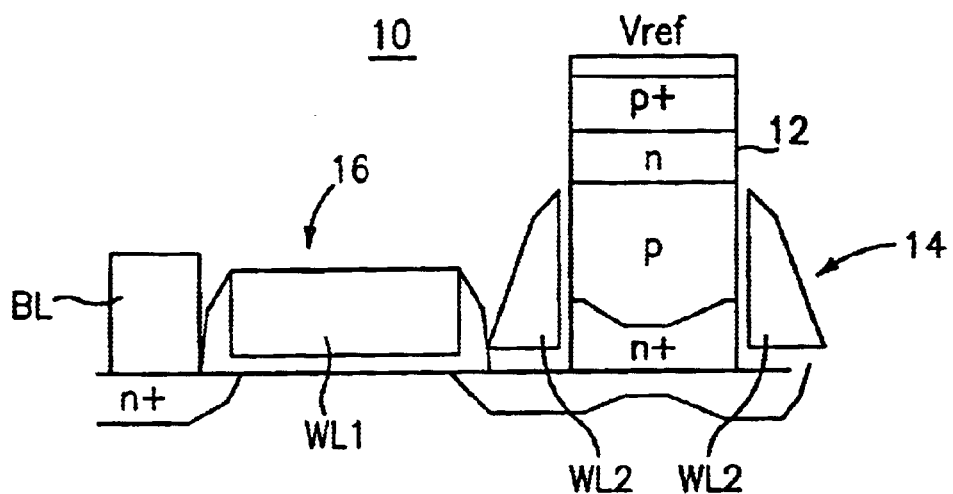
FIG. 1 illustrates the device structure of a prior art T-RAM cell.
Figure 2:
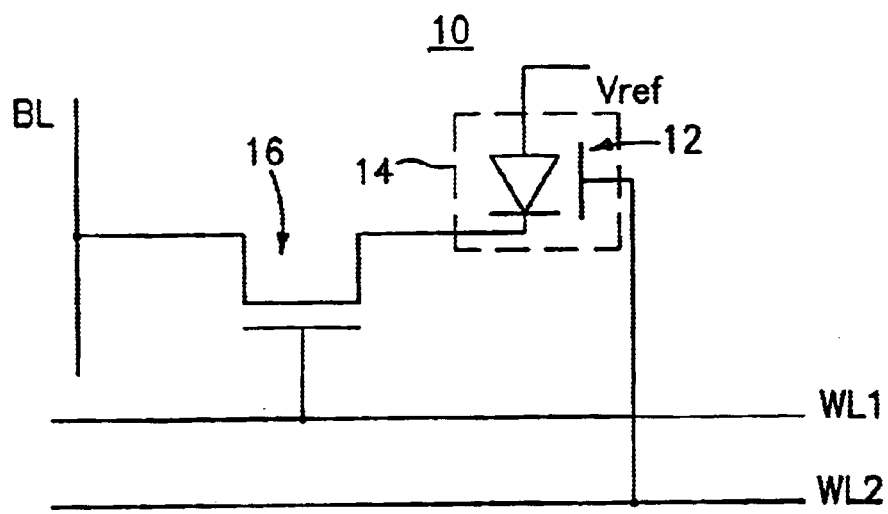
FIG. 2 is a circuit diagram of the prior art T-RAM cell.

With the method of the present invention, minimal process steps and mask levels are required to fabricate the T-RAM cells 200, and the p-MOS and n-MOS support devices 210, 220 which results in a significant saving in manufacturing cost and provides a better thermal budget over prior art methods. The planar T-RAM structure is easy to fabricate, since the depth of focus for the lithographic tools and metal interconnects is easier to handle than the three-dimensional vertical device of the prior art T-RAM structure (see FIG. 1).

By sharing implant and diffusion steps, thermal budget is tightly controlled. This leads to better device quality and reliability. Otherwise, extra thermal steps needed to form T-RAM cells will cause the junction depth of the normal device deeper which leads to higher junction capacitance and poorer performance. Additionally, the T-RAM cells having the gated-lateral thyristor storage element which are fabricated according to the inventive method are suitable for future scaling than the prior art T-RAM cells which have the vertical thyristor.

Further, the method of the present invention provides T-RAM cells having a size of less than or equal to $6F^2$.

What has been described herein is merely illustrative of the application of the principles of the present invention. Other arrangements and methods, such as using different substrates, may be implemented by those skilled in the art without departing from the scope and spirit of this invention.

What is claimed is:

1. A memory system comprising a plurality of T-RAM memory cells arranged in an array; wherein
each of the plurality of T-RAM memory cells includes a first and a second horizontal device, said first and second horizontal device being approximately the same height, each of said first and second horizontal device having a planar top surface, and
said second horizontal device includes a halo region created using a halo implant to limit a footprint of each memory cell to less than or equal to $6F^2$.

2. The memory system as in claim 1, wherein the first horizontal device is a thyristor and the second horizontal device is a transfer gate.

3. The memory system as in claim 2, wherein the halo region is of a single polarity.

4. The memory system as in claim 3, wherein the single polarity halo region of the transfer gate is fabricated in the same steps as a halo region of the thyristor.

5. The memory system as in claim 1, wherein the first device is a p-MOS device and the second device is an n-MOS device.

6. The memory system as in claim 5, wherein the p-MOS device comprises an n-type halo region and the n-MOS device comprises a p-type halo region.

7. The memory system as in claim 6, wherein the n-type halo region of the p-MOS device is fabricated simultaneously with fabrication steps for fabrication of a halo region of the T-RAM cells and the p-type halo region of the n-MOS device is fabricated simultaneously with fabrication steps for fabrication of a second halo region of the T-RAM cells.

* * * * *